(12) United States Patent
Paulsen et al.

(10) Patent No.: US 10,784,573 B2
(45) Date of Patent: Sep. 22, 2020

(54) ADAPTIVE ANTENNA TUNING DURING TRANSMISSION

(71) Applicant: Silicon Laboratories Inc., Austin, TX (US)

(72) Inventors: Olfert Paul Paulsen, Dragør (DK); Emil Feldborg Buskgaard, Copenhagen K (DK); Michael Hansen, Køge (DK)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/156,351

(22) Filed: Oct. 10, 2018

(65) Prior Publication Data

US 2020/0119440 A1    Apr. 16, 2020

(51) Int. Cl.
 *H01Q 1/50*    (2006.01)
 *H04B 1/40*    (2015.01)
 *H03H 7/38*    (2006.01)

(52) U.S. Cl.
 CPC ............... *H01Q 1/50* (2013.01); *H03H 7/38* (2013.01); *H04B 1/40* (2013.01)

(58) Field of Classification Search
 CPC ............ H01Q 1/50; H03H 7/38; H04B 1/40
 USPC ........................................................ 455/78
 See application file for complete search history.

(56) References Cited

U.S. PATENT DOCUMENTS

| 9,781,612 | B2 | 10/2017 | Buskgaard et al. |
| 2013/0331042 | A1* | 12/2013 | See .................. H04W 52/367 455/77 |
| 2015/0116159 | A1* | 4/2015 | Chen ..................... H01Q 5/22 343/702 |
| 2018/0269857 | A1* | 9/2018 | Zachara ............... H01Q 21/28 |
| 2019/0108704 | A1* | 4/2019 | Witkowski ......... G07C 9/00174 |

OTHER PUBLICATIONS

Buskgaard, Emil Feldborg. "The Dynamics of the User Effect on Electrically Small Antennas." Dissertation submitted Dec. 2016. Published by Aalborg University Press, Skjernvej 4A, $2^{nd}$ Floor, DK 9220 Aalborg Ø. pp. 1-82.

* cited by examiner

*Primary Examiner* — Ayodeji O Ayotunde
(74) *Attorney, Agent, or Firm* — Gary Stanford

(57) ABSTRACT

A system and method of adaptively tuning an antenna of a wireless device including detecting a reflected electrical signal from the antenna during transmission of a wireless signal, converting the reflected electrical signal into at least one parameter indicative of its strength, and adjusting, based on the at least one parameter, a tune value to adjust a matching network during the transmission of the wireless signal to reduce the strength of the reflected electrical signal. The reflected electrical signal may be converted to a corresponding power value, and the tune value may be repeatedly adjusted by an incremental amount or according to a binary search method or the like to reduce the power level of the reflected electrical signal. The reflected electrical signal may be demodulated into demodulated information used to determine an optimal transfer function of the matching network and the tune value may be adjusted accordingly.

20 Claims, 5 Drawing Sheets

ADAPTIVE ANTENNA TUNING DURING TRANSMISSION

BACKGROUND OF THE INVENTION

Field of the Invention

The present invention relates in general to wireless communications, and more particularly to a system and method of adaptively tuning an antenna during transmission.

Description of the Related Art

Various wireless communication protocols are known for enabling and controlling wireless communications using antennas or the like. The antenna of a wireless transmitter may be tuned to the impedance of a given transmission medium (e.g., open air) at a given frequency to transmit the signal with a maximum amount of energy and with a minimum amount of reflected energy. The transmission medium, however, may be dynamic in which case changes in the medium may cause detuning of the antenna. The impedance of a wireless medium, for example, may be modified by nearby physical objects moving near the antenna during transmission causing detuning of the antenna. When the antenna is detuned, transmitted power may be reflected back into the transmitter causing a reduction of transmitted power and possibly increased harmonic levels. The reduced transmitted power results in a lower signal at the receiver, and the increased harmonic levels may interfere with other signals received by other wireless receivers. A detuned antenna, therefore, reduces the efficiency and may lead to interruption or even failure of wireless communications.

A home automation application may use a wireless communication protocol for signaling and control. The home automation application may include multiple sensors, such as window or door sensors, heat sensors, lighting sensors, flood (or water) sensors, etc., and may also include various remote control devices, such as handheld devices or smart phones and the like. The movement of a hardwood or steel door adjacent a door sensor may cause detuning of the door sensor antenna. The water surrounding a flood sensor may modify sensor parameters including detuning of the flood sensor antenna. A human hand interfacing a remote control device, such as touching a screen or pushing a button, may modify antenna parameters thereby detuning the device antenna.

Z-Wave is a wireless communications protocol used primarily for home automation applications and the like. Z-Wave uses radio frequency (RF) energy for signaling and control of wireless devices, and is often used in locks, security systems, lighting, heating, cooling and home appliances.

SUMMARY OF THE INVENTION

A wireless device with adaptive antenna tuning according to one embodiment includes an antenna, a matching network, an electrical communication path, a directional coupler, a detector, and a controller. The matching network is coupled to the antenna and has a tuning input for receiving a tune signal for tuning the antenna. The electrical communication path is coupled to the matching network for conveying electrical signals to and from the antenna. The directional coupler interfaces the electrical communication path to detect a reflected electrical signal from the antenna during transmission of a wireless signal. The detector converts the reflected electrical signal into at least one parameter indicative of a strength of the reflected electrical signal. The controller adjusts the tune signal based on the at least one parameter during transmission to reduce a strength of the reflected electrical signal.

The matching network may include one or more adjustable components to facilitate tuning. For example, the matching network may include at least one adjustable capacitance that is adjusted by the tune signal.

The detector may be a power detector that provides a power value indicative of a power level of the reflected electrical signal. In one embodiment, the controller repeatedly adjusts the tune signal and monitors the power value to reduce the power value. The tune signal may be adjusted until the power value is no greater than a threshold power value. The tune signal may be repeatedly adjusted by an incremental amount, or may be repeatedly adjusted according to a binary search method.

The detector may be a measurement receiver that demodulates the reflected electrical signal into demodulated information, such as, for example, amplitude and phase information. The controller may use the demodulated information to determine a value of the tune signal that achieves an optimal transfer function of the matching network. For example, the controller may use the demodulated information to calculate an input impedance of the matching network, to calculate an input impedance of the antenna based on the input impedance of the matching network and a transfer function of the matching network, to calculate an optimal output impedance of the matching network based on the input impedance of the antenna, to calculate an optimal transfer function of the matching network based on the optimal output impedance of the matching network, and may then choose a value of the tune signal that adjusts the transfer function of the matching network that is sufficiently close to the optimal transfer function.

In another embodiment, the matching network may be modified by a transfer function offset before demodulating the reflected electrical signal. Such transfer function offset is intended to increase the strength of the reflected electrical signal to potentially provide more accurate results.

The wireless device may include a Z-wave transceiver that performs transmit and receive operations according to a Z-wave wireless communications protocol.

A method of adaptively tuning an antenna of a wireless device according to one embodiment includes detecting a reflected electrical signal from the antenna during transmission of a wireless signal, converting the reflected electrical signal into at least one parameter indicative of a strength of the reflected electrical signal, and adjusting, based on the at least one parameter, a tune value to adjust a matching network coupled to the antenna during the transmission of the wireless signal to reduce the strength of the reflected electrical signal.

The method may include adjusting a transfer function of the matching network. The method may include adjusting a capacitance of the matching network. The method may include converting the reflected electrical signal into a power value indicative of a power level of the reflected electrical signal, and repeatedly adjusting the tune value to reduce the power value. The method may include repeatedly adjusting the tune value until the power value is no greater than a threshold power value. The method may include repeatedly adjusting the tune value by an incremental amount. The method may include repeatedly adjusting the tune value according to a binary search method.

The method may include demodulating the reflected electrical signal into demodulated information used to determine an optimal transfer function of the matching network, and adjusting the tune value to modify the transfer function of the matching network towards the optimal transfer function. For example, the method may include using the demodulated information to calculate an input impedance of the matching network, calculating an input impedance of the antenna based on the input impedance of the matching network and a transfer function of the matching network, calculating an optimal output impedance of the matching network based on the input impedance of the antenna, calculating an optimal transfer function of the matching network based on the optimal output impedance of the matching network, and adjusting the tune value to adjust a transfer function of the matching network that is sufficiently close to the optimal transfer function. The method may include modifying the matching network by a transfer function offset prior to demodulating the reflected electrical signal.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

The inventors have recognized the need to tune an antenna operating in a dynamic transmission environment during wireless communication. They have therefore developed a wireless device with adaptive antenna tuning. The wireless device includes an antenna, an electrical communication path, a directional coupler, a detector, and a tuning controller. The antenna may be coupled to a matching network having a tuning input receiving an adjust signal for tuning the antenna. The electrical communication path is provided for conveying electrical signals used for transmitting and receiving wireless signals via the antenna. The directional coupler is configured to detect a reflected signal on the electrical communication path from the antenna during a transmit operation while transmitting a wireless signal. The detector receives the reflected signal present on the output of the directional coupler and converts the reflected signal to at least one parameter indicative of the relative strength of the reflected signal, such as the power level or the like. The tuning controller provides the adjust signal based on the detected parameter(s) to tune the antenna during the transmit operation to reduce the power level of the reflected signal.

When the transmit and receive frequencies are the same or substantially the same, and when transmit and receive functions are separated by a relatively short amount of time, then the tuned antenna is also optimal for receiving wireless signals in the same transmission medium.

In one embodiment, the detector may be a power detector that provides a power value indicative of a power level of the reflected signal, in which case the tuning controller repeatedly adjusts the tune signal and monitors the power value to reduce the power level of the reflected signal. Such repeated adjustment may be performed during the entire duration of the wireless signal being transmitted, until a minimum power level is found, or until the power level reaches a predetermined threshold power level. The repeated adjustment may be limited to a portion of the wireless signal that does not include the packet payload, such as, for example, a preamble. The adjustment may be according to an incremental approach or a binary search method or the like. In another embodiment, the detector may be a measurement receiver circuit that demodulates the reflected signal into demodulated information such as an amplitude value and a phase value, which demodulated information is used by the tuning controller to determine a value of the adjust signal that achieves an optimal impedance of the antenna system to minimize strength (e.g., power level) of the reflected signal.

Figure 1:
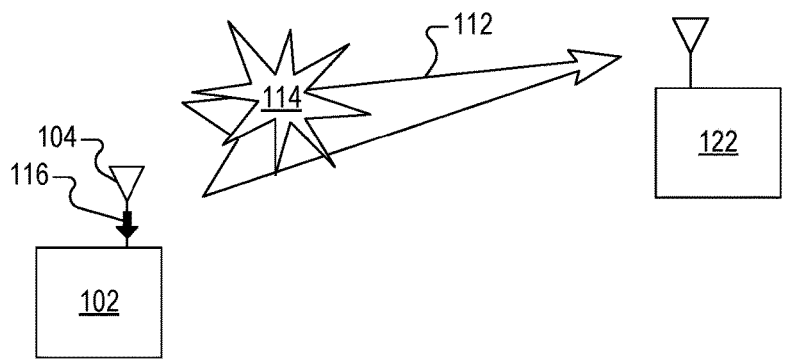
FIG. 1 is a figurative block diagram depicting wireless transmission in a dynamic transmission medium in which a nearby object obstructs the wireless transmission.

FIG. 1 is a figurative block diagram depicting wireless transmission in a dynamic transmission environment in which a nearby object obstructs the wireless transmission. A first wireless device 102 transmits a wireless signal 112 via its antenna 104 to a second wireless device 122. The antenna 104 may be viewed as an impedance converter that converts the impedance of an electrical version of the wireless signal 112 to a radiation impedance of the transmission medium through which the wireless signal 112 is transmitted. Under ideal or near-ideal conditions, the antenna 104 may be tuned to a default impedance or the like that ensures maximum transmission of power to the wireless device 122. The nearby object 114, however, may alter the electric field (E-Field) and the magnetic field (H-field) of the transmission medium altering its corresponding radiation impedance. The nearby object 114, therefore, alters the impedance of the system causing a mismatch between the antenna 104 and the radiation impedance thereby interfering with the transmission of the wireless signal 112. When the antenna 104 is detuned in this manner, a portion of the power intended for transmission of the wireless signal 112 is instead reflected back from the antenna 104 towards the matching network 216 in the form of a reflected electrical signal 116, which causes reduced transmitted power and possibly increased harmonic levels. A detuned antenna caused by a nearby object, therefore, reduces the efficiency and may lead to interruption or even failure of the wireless communications.

As an example, the wireless devices 102 and 122 may be part of a home automation application which uses wireless communications for signaling and control. Any suitable wireless protocol is contemplated, such as Z-wave or the like that uses radio frequency (RF) energy for signaling and control of wireless devices. The wireless device 102 may be configured as a sensor or the like, such as a window or a door sensor, a heat sensor, a lighting sensor, a water sensor, etc., or may be configured as a remote control device, such as a handheld device or a smart phone or the like. The nearby object 114 causing the reflected electrical signal 116 at the antenna 104 may depend upon the particular configuration or application. The movement of a hardwood or steel door adjacent a door sensor may cause detuning of the door sensor antenna. The water surrounding a flood sensor may modify sensor parameters including detuning of the flood sensor antenna. A human hand interfacing a remote control device, such as touching a screen or pushing a button, may modify antenna parameters thereby detuning the antenna of the remote control device. The wireless device 102 is configured with adaptive antenna tuning as described herein to tune the antenna 104 to minimize a power level of the reflected signal during transmission.

Figure 2:
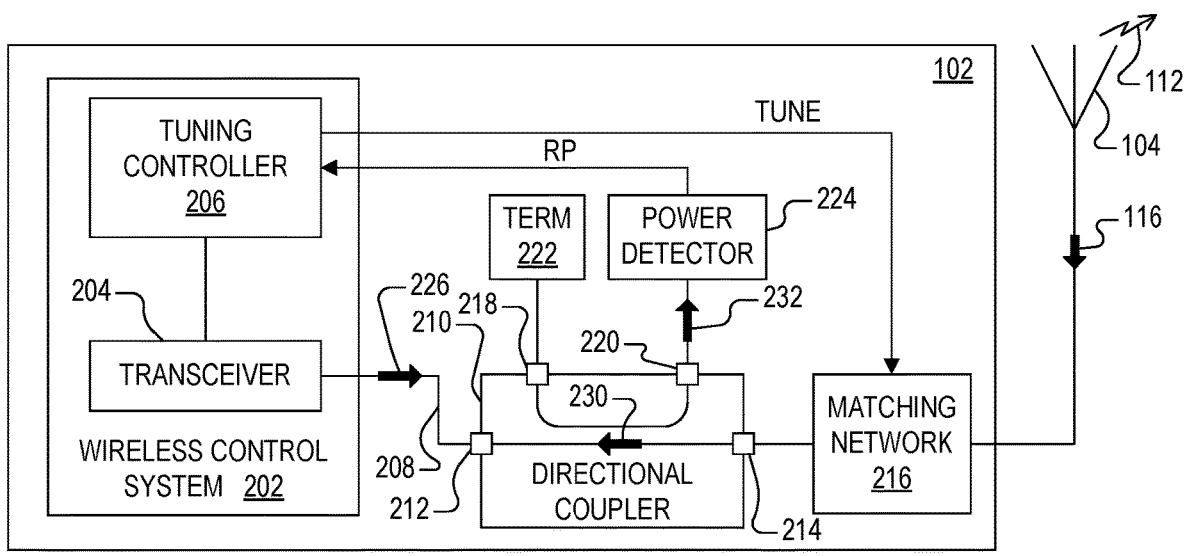
FIG. 2 is a simplified block diagram of the wireless device using a power detector and a search method for adaptive antenna tuning according to one embodiment.

FIG. 2 is a simplified block diagram of the wireless device 102 using a power detector 224 and a search method for adaptive antenna tuning according to one embodiment. The wireless device 102 includes a wireless control system 202 which further includes a transceiver 204 coupled to a tuning controller 206. The transceiver 204 has an input/output (I/O) port interfacing an electrical communication path 208 used for transporting electrical signals to and from the antenna 104. A directional coupler 210 is coupled to or otherwise interposed along the electrical communication path 208. The directional coupler 210 includes a first port 212 coupled to the electrical communication path 208 and a second port 214 coupled to one terminal of a matching network 216. The matching network 216 includes another terminal coupled to the antenna 104. The directional coupler 210 may generally be considered a lossless device in which the electrical communication path 208 essentially extends through the directional coupler 210 between the first and second ports 212 and 214 and to the matching network 216. The directional coupler 210 further includes a third port 218 and a fourth port 220. The third port 218 is coupled to a terminator 222 and the fourth port 220 is coupled to the input of a power detector 224. The power detector 224 has an output providing a reflected power (RP) value to an input of the tuning controller 206 of the wireless control system 202. The tuning controller 206 provides a TUNE signal to a tuning input of the matching network 216.

An electrical signal 226 to be transmitted by the transceiver 204 is asserted onto the electrical communication path 208 through the directional coupler 210 to the matching network 216, in which the matching network 216 and the antenna 104 convert the electrical signal 226 to a wireless signal transmitted by the wireless device 102, such as, for example, the wireless signal 112. A wireless signal (not shown) received by the antenna 104 is converted by the matching network 216 and the antenna 104 into an electrical signal (not shown) asserted onto the electrical communication path 208, which passes through the directional coupler 210.

As previously described, during transmission of the wireless signal 112, a nearby object 114 alters the impedance of the antenna 104 causing the antenna 104 to be detuned. Such detuning results in part of the energy (or power) for generating the wireless signal 112 to be reflected at the antenna 104 and the matching network 216 and onto the communication path 208. The reflected electrical signal 116 is asserted on the electrical communication path 208 in the form of a reflected electrical signal 230, and the directional coupler 210 is configured to detect the reflected electrical signal 230 (distinguished from the electrical signal 226 being transmitted) and to generate a substantially similar electrical signal 232 at the input of the power detector 224. The electrical signal 232 is essentially a sample of the reflected electrical signal 230, which in turn represents the reflected electrical signal 116. The power detector 224 receives the electrical signal 232 and generates the reflected power value RP, in which RP represents the power level of the reflected electrical signal 116. The RP value may have any suitable form, such as a voltage value, a current value, or a digital value. The RP value is provided to the tuning controller 206, which in turn adjusts the TUNE signal in an attempt to reduce the power level of the reflected electrical signal 116 by reducing the magnitude or value of RP as further described herein.

In summary, the nearby object 114 detunes the antenna 104 during transmission of the wireless signal 112 by the wireless device 102, causing the reflected electrical signal 116 at the antenna 104 and the reflected electrical signal 230 on the electrical communication path 210. The directional coupler 210 detects the reflected electrical signal 230 and the power detector 224 generates the RP value representing the power level of the reflected electrical signal 230 and thus the reflected electrical signal 116. The tuning controller 206 receives RP and adjusts the TUNE signal to essentially "re-tune" the antenna 104 to reduce or minimize the reflected electrical signal 116. As further described herein, the tuning controller 206 searches for a value of TUNE that reduces or minimizes the power level of the reflected electrical signal 116.

Figure 3:
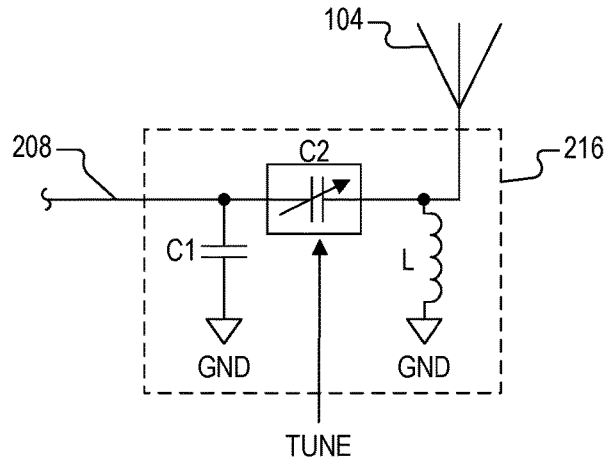
FIG. 3 is a schematic diagram of the matching network of FIG. 2 implemented according to one embodiment coupled to the antenna.

FIG. 3 is a schematic diagram of the matching network 216 implemented according to one embodiment coupled to the antenna 104. In this case, the electrical communication path 208 is coupled to one end of a capacitor C1 and to one end of a variable capacitor C2. The other end of the capacitor C1 is coupled to a reference node, such as ground (GND), and the other end of the variable capacitor C2 is coupled to one end of an inductor L and to a terminal of the antenna 104. The other end of the inductor L is coupled to a reference node, such as GND. TUNE is provided to an adjust input of the variable capacitor C2, in which TUNE adjusts the capacitance of C2 and thus changes the impedance of the matching network 216 to effectively tune the antenna 104.

Alternative configurations of the matching circuit 216 are contemplated. For example, in another embodiment C1 may be adjustable while C2 is fixed, or both C1 and C2 may be adjustable. In yet another embodiment, L may be an adjustable component. It is understood that any one of many other types of matching network configurations with tunable devices or elements may be used as the matching network 216.

Many different types of adjustable devices are known (e.g., digital control, voltage control, current control, etc.) and may be used as an adjustable device (e.g., adjustable capacitor, adjustable inductor) within the matching network 216. In one embodiment of the configuration shown in FIG. 3 using the adjustable capacitor C2, the adjustable capacitor C2 may be configured a digitally controlled capacitor bank (not shown) in which TUNE is a digital signal used for adjusting the capacitance of C2. In another embodiment the adjustable capacitor C2 may be configured as a voltage controlled capacitor in which TUNE is a voltage value having an adjustable magnitude used for adjusting the capacitance of C2. Adjustable or variable inductors are also known and may be used within the matching network 216 for tuning the antenna 104.

Figure 4:
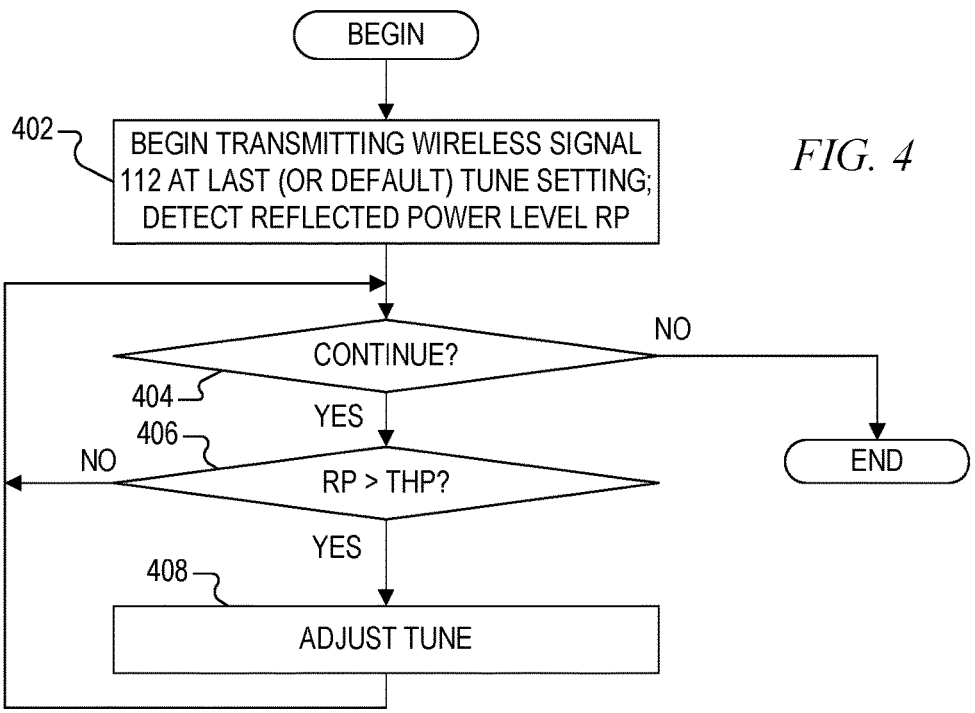
FIG. 4 is a flowchart diagram illustrating operation of the wireless device of FIG. 1 for reducing the power level of the reflected signal to a threshold level according to one embodiment of the present invention.

FIG. 4 is a flowchart diagram illustrating operation of the wireless device 102 for reducing the power level of the reflected electrical signal 116 to a threshold level according to one embodiment of the present invention. At block 402, the wireless device 102 begins transmitting the wireless signal 112 using an initial value of TUNE. The transceiver 204 encapsulates information to be transmitted into a frame, modulates the frame into a wireless packet, and asserts the frame onto the electrical communication path 208. The modulated frame energizes the antenna 104, which then transmits the wireless packet as the wireless signal into the transmission medium. The wireless packet may include a preamble which may include known information or a repeating pattern (e.g., repeating pattern of 1's and 0's), and which may be transmitted at a known rate and/or may have a predetermined duration. A preamble, if included, may be used by wireless receivers to detect a wireless signal and possibly to wake up if in sleep mode, to synchronize with the transmitter, and to adjust gain to reliably capture and demodulate the information contained within the wireless signal. The directional coupler 210 and the power detector 224 are used to detect the power level of the reflected electrical signal 116, if any, and to convert the power level to the RP value. The RP value may be updated on a continuous or repeated basis.

At block 402, the initial value of TUNE may be set to a "default" tune setting or may be set to the last known valid tune setting. The default value may be set according to an ideal impedance of the antenna 104 assuming an ideal or standard transmission medium with minimum interference and absence of any significant interfering nearby objects, such as the nearby object 114. The value of TUNE may have been adjusted during a last wireless transmission if a nearby object interfered with the last wireless transmission, in which case this updated value of TUNE may be used as the initial value rather than the default value.

At next block 404, a CONTINUE flag or the like is queried to determine whether to "continue" adjusting the impedance of the antenna 104 via TUNE. In one embodiment, CONTINUE is set to true so that adjustment may continue for the entire duration of the wireless signal 112. In another embodiment, CONTINUE is conditional on completion of a portion of the wireless signal, such as, for example, completion of a preamble. It may be desired, for example, to re-tune the antenna 104 during transmission of the preamble rather than during the payload of the wireless packet containing the information being transmitted. While CONTINUE is true (e.g., while the preamble is still being transmitted), operation advances to block 406 to query whether RP is greater than a predetermined power threshold value THP. THP represents an acceptable power threshold for the reflected electrical signal 116, so that when RP is greater than THP, then additional tuning is desired, and when RP is equal to or less than THP, the antenna 104 is considered sufficiently tuned. THP may be empirically determined during manufacture or during preliminary testing. Also, THP may be a fixed or a programmable value. THP may initially be stored as a default value, which may further be programmed to different values for different configurations or applications.

When RP is greater than THP as determined at block 406, operation advances to block 408 to adjust the value of the TUNE signal in an attempt to reduce or otherwise minimize RP at least down to THP. After TUNE is adjusted, operation returns to block 404 to query the CONTINUE flag. Operation loops between blocks 404 and 408 while CONTINUE is true (e.g., during the preamble) to repeatedly adjust TUNE until RP is equal to or less than THP. When TUNE has been adjusted so that RP is less than or equal to THP during the preamble, operation returns instead back to block 404 and operation loops between blocks 404 and 406 while CONTINUE is true. Operation is completed when CONTINUE is false (such as, for example, when the preamble has ended or when transmission is completed), in which case TUNE is held constant for the remainder of the wireless signal 112, if any, and possibly for use receiving a subsequent wireless signal.

If for any reason RP is not reduced to at least THP during the duration of the preamble, then remedial measures may be taken at a higher communication level. Even if not reduced to THP, for example, communication might still be successful in which the wireless device 122 successfully received the wireless signal 112 and acknowledges successful receipt. In certain configurations, if the wireless device 122 detected that a communication was attempted but was not successfully received, it may request a re-transmission. When the wireless signal 112 is not acknowledged or otherwise not deemed successful, the wireless device 102 may attempt re-transmission since anything causing the deficient condition of the transmission medium may have since been removed.

The adjustment of the value of TUNE at block 408 may be according to any suitable search method for reducing RP. In one embodiment, the tuning controller 206 incrementally adjusts TUNE by a relatively small amount during each iteration while monitoring RP. In one embodiment, the incremental adjustment amount may be the smallest possible adjustment, such as bit-by-bit for a digital configuration or by a smallest incremental voltage value in a voltage-controlled configuration. In another embodiment, the incremental adjustment amount may be selected at a level that is likely to change RP by a small yet measurable amount. If one or more incremental adjustments of TUNE in one direction causes RP to increase, then the tune controller 206 instead incrementally adjusts in another direction to reduce RP. For example, if the tune controller 206 incrementally adjusts TUNE to increase the capacitance of C2 causing RP to increase, then the tune controller 206 reverts back to the initial value of TUNE and incrementally adjusts TUNE to decrease the capacitance of C2 in an attempt to cause RP to decrease. If and when RP decreases to a point at or below the threshold level THP, the corresponding value of TUNE is held constant for the remaining duration of the wireless signal 112.

An incremental adjustment approach may need a significant number of iterations to reduce the power level of the reflected electrical signal 116, as indicated by RP, to a suitable level. In certain wireless protocols, such as Z-wave, the preamble is sufficiently long in duration to allow an incremental approach to be used during transmission of the preamble. As an example, Z-wave has 3 different bit rates, including 9.6 kilobits per second (kbs), 40 kbs, and 100 kbs. A Z-wave frame may include 10-12 Bytes of preamble having a duration of 1-10 milliseconds (ms). Such preamble is sufficiently long to adjust TUNE to minimize the power level of a reflected signal during transmission of the preamble.

TUNE may also be adjusted according to any suitable binary search method. During a binary search, the initial adjustments of TUNE are larger and are successively reduced (e.g., halved) for each adjustment iteration to converge on a final TUNE value. A binary search method or the like may converge more quickly on a suitable value for TUNE as compared to an incremental adjustment approach. In this manner, a binary search method may be suitable for wireless protocols using shorter preambles.

As an example, a suitable range for TUNE may first be determined with corresponding minimum and maximum TUNE values defining the extent of the suitable range. If an initial value of TUNE results in RP greater than THP, then the initial value of TUNE is considered a "first" value and TUNE may be adjusted to a second value that is half the distance between the first value and either extent of the suitable range, such as, for example, the minimum value. If RP is successfully reduced using the second value but still greater than THP, then the process may be repeated in the same direction in which TUNE is adjusted to a third value that is half the distance between the second value and the minimum value. Operation is repeated in subsequent iterations until RP is reduced to THP or the minimum value of the suitable range is reached. If instead RP increases using the second value in the direction of the minimum value, then TUNE is adjusted in the opposite direction to a third value that is half the distance between the first value and the maximum value of the suitable range. If RP is reduced using the third value, then the process is repeated in the same direction towards the maximum value of the suitable range. If RP increases during any iteration in either direction, adjustment is instead made in the opposite direction. Such binary process is repeated until RP is reduced at or below THP or when a minimum value of RP is achieved.

Figure 5:
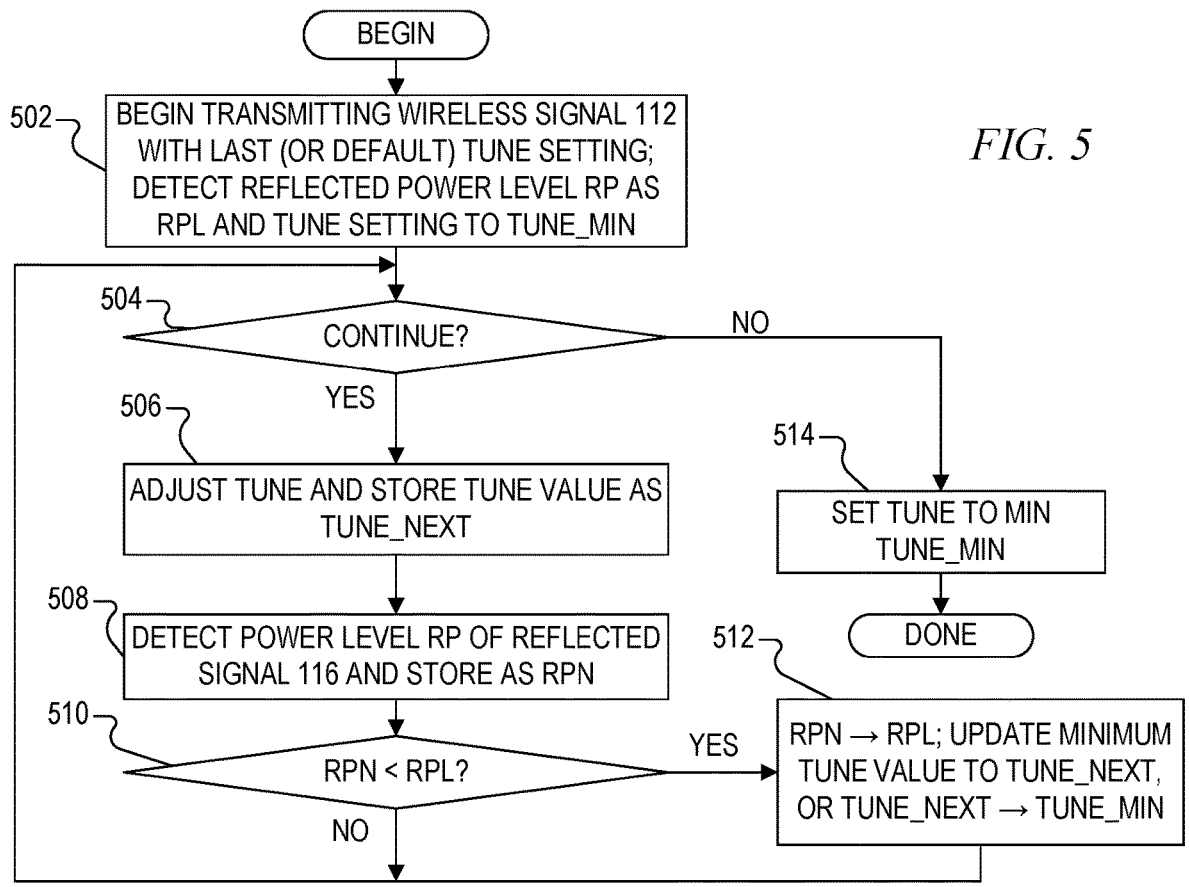
FIG. 5 is a flowchart diagram illustrating operation of the wireless device of FIG. 1 for minimizing the power level of the reflected signal according to another embodiment of the present invention.

FIG. 5 is a flowchart diagram illustrating operation of the wireless device 102 for minimizing the power level of the reflected electrical signal 116 according to another embodiment of the present invention. Operation begins at block 502, which is similar to block 402 in which the wireless device 102 begins transmitting the wireless signal 112 at the last or default setting of TUNE, and the power level of the reflected electrical signal 116 is detected as RP. In this case, however, the RP value is stored as a "last" power level value RPL and the initial setting of TUNE is stored as a value TUNE_MIN.

At next block 504, the CONTINUE flag is queried in similar manner as previously described. While CONTINUE is true, operation advances to block 506 in which TUNE is adjusted to a next value according to the applicable search method and the next setting of TUNE is stored as a "next" value TUNE_NEXT. The search method performed to adjust TUNE at block 506 may be any suitable search method, such as an incremental adjustment method, a binary search method, etc. At next block 508, the power level of the reflected electrical signal 116 is detected as RP and stored as a "next" power level value RPN. At this point, the first value of RP is stored as a last value RPL and the next value of RP is stored as RPN corresponding to the adjusted value of the TUNE signal TUNE_NEXT. At next block 510, it is queried whether RPN is less than RPL. If RPN is less than RPL, then the new value of TUNE has improved wireless communications and operation advances to block 512 in which RPN is copied and stored as RPL and RTUNE_NEXT is stored as TUNE_MIN. In other words, TUNE_MIN is updated with an improved adjustment value for TUNE that corresponds with the reduced value of RP, now stored as RPL. After TUNE_MIN is updated at block 512, operation returns to block 504 to query CONTINUE (e.g., to determine whether the preamble is still being transmitted).

If instead RPN is not less than RPL as determined at block 510, then the updated value of TUNE did not improve wireless communications so that the current value of TUNE remains the best setting so far. RPL also corresponds with the current value of TUNE, so that neither are changed for the next iteration. Operation then returns to block 504 to query CONTINUE as previously described.

Operation loops between blocks 504 and 512 while CONTINUE is true in which TUNE is adjusted in each iteration and a value TUNE_MIN is determined that corresponds with the lowest value of RP. When CONTINUE is true (e.g., the preamble is completed) as determined at block 504, operation exits the loop and advances instead to block 514 in which TUNE is set to TUNE_MIN to achieve the lowest power level of the reflected electrical signal 116, and operation is completed. TUNE remains set to TUNE_MIN during the remaining duration of the wireless signal 112, if any, and for any subsequent receive operation. The primary difference between the embodiments of FIGS. 4 and 5 is that in FIG. 4, operation is completed when RP is less than or equal to the threshold power level THP, whereas in FIG. 5 RP is repeatedly adjusted while CONTINUE remains true. The embodiment of FIG. 4 has a benefit in that TUNE may be resolved more quickly, whereas in FIG. 5 the power level of the reflected electrical signal 116 may be reduced even further to potentially improve transmission efficiency.

A combination of the embodiments of FIGS. 4 and 5 is contemplated in which an additional query step similar to block 406 may be added after block 504 in which operation is completed when a threshold is achieved. The threshold in this combined case, however, may be set lower than THP of FIG. 4 to minimize reflected power level.

Figure 6:
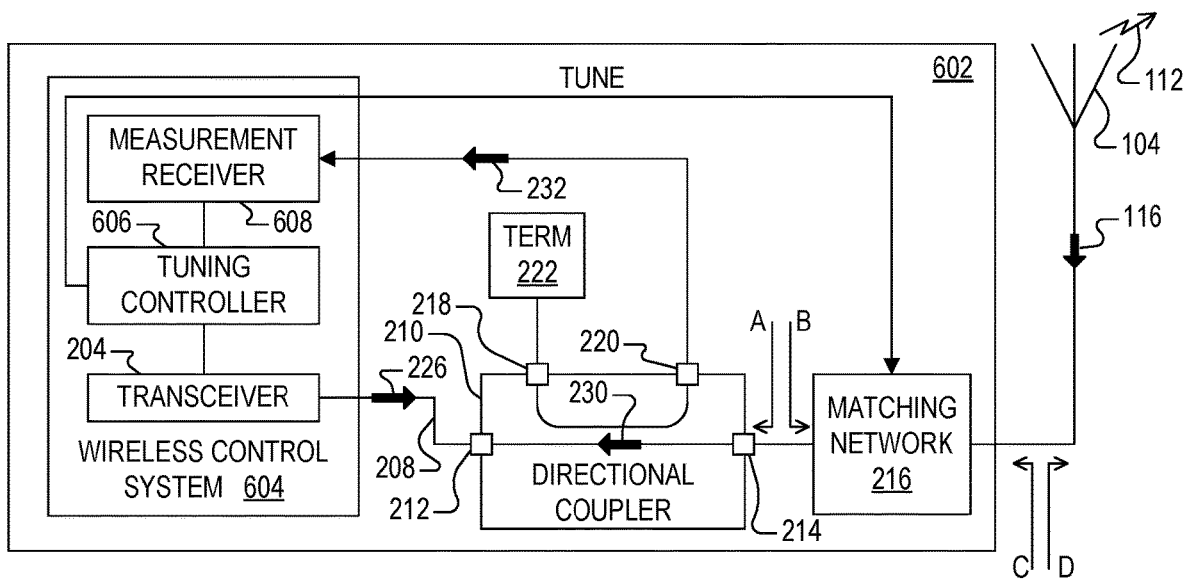
FIG. 6 is a simplified block diagram of another wireless device using a measurement receiver to measure amplitude and phase of the reflected signal according to another embodiment of the present invention.

FIG. 6 is a simplified block diagram of a wireless device 602 using a measurement receiver 608 to measure amplitude and phase of the reflected electrical signal 116 according to another embodiment of the present invention, which may be used instead of the wireless device 102. The wireless device 602 is configured to operate in a similar manner as the wireless device 102 and includes similar components operating in a similar manner. The wireless control system 202 is replaced by a wireless control system 604, in which the wireless control system 604 includes the transceiver 204 having an I/O port interfacing the electrical communication path 208 used for transporting electrical signals to and from the antenna 104 in a similar manner as the wireless device 102. For example, the transmitted electrical signal 226 is shown asserted on the electrical communication path 208 for generating the wireless signal 112 as previously described. The directional coupler 210, the matching network 216, and the terminator 222 are included and coupled to operate in substantially the same manner, in which the electrical communication path 208 is coupled to and through ports 212 and 214 of the directional coupler 210 to the matching network 216 in similar manner, the matching network 216 is coupled to tune the antenna 104 in similar manner, and the terminator 222 is coupled to port 218 of the directional coupler 210 in similar manner.

When the wireless device 602 generates an electrical signal, such as the electrical signal 226, to transmit a wireless signal, such as the wireless signal 112, a nearby object, such as the nearby object 114, detunes the antenna 104 causing the reflected electrical signal 116 in a similar manner as described for the wireless device 102. As previously described, the reflected electrical signal 116 is asserted on the electrical communication path 208 in the form of a reflected electrical signal 230, and the directional coupler 210 detects the reflected electrical signal 230 and generates a substantially similar electrical signal 232.

In this case, however, the electrical signal 232 output from the directional coupler 210 is provided to an input of a measurement receiver 608 instead of the power detector 224 (which is either not included or not used). The measurement receiver 608 is configured to demodulate the electrical signal 232 into demodulated information, such as into an amplitude value and a phase value indicative of the reflected electrical signal 116. The tuning controller 206 is replaced by a tuning controller 606, which uses the demodulated information provided by the measurement receiver 608 to determine an optimal value for TUNE. The optimal value of TUNE adjusts the impedance of the matching network 216 to tune the antenna 104 in such a manner to reduce or otherwise minimize the power level of the reflected electrical signal 116. In other words, rather than a multistep search method used to minimize a measured power level, the measurement receiver 608 and the tuning controller 606 are used to adjust TUNE in a single step or at least in a minimal number of steps. If for any reason the amplitude and phase information indicate that the first adjusted TUNE value does not minimize the power level of the reflected electrical signal 116, then the process may be repeated as necessary or as desired to minimize the power level of the reflected electrical signal 116.

A set of arrows indicate a corresponding one of impedances A, B, C, and D. An impedance A is the impedance looking into the transceiver 204 through the directional coupler 210. The directional coupler 210 is seen as transparent and its effect on the output impedance of the transceiver 204 is known. An impedance B is the impedance of the matching network 216 as it appears to the transceiver. An impedance C is the "output" impedance of the matching network 216 during a transmit operation. An impedance D is the impedance of the antenna 104 as modified by changes of the transmission medium. The transfer function of the directional coupler 210 for converting the reflected electrical signal 230 into the electrical signal 232 is known or fully characterized. The structure and transfer function of the matching network 216 is known (or may otherwise be calculated or determined) for each value of TUNE. The measurement receiver 608 determines the amplitude and phase of the electrical signal 232 indicative of the amplitude and phase of the reflected electrical signal 116, and the tuning controller 606 uses this information to determine or otherwise use impedances A-D to adjust TUNE. It is noted that in one embodiment, the output impedance of the transceiver is 50 Ohms ($\Omega$) and the terminator 222 has an impedance of 50$\Omega$. Alternative configurations with different impedance values are contemplated.

Figure 7:
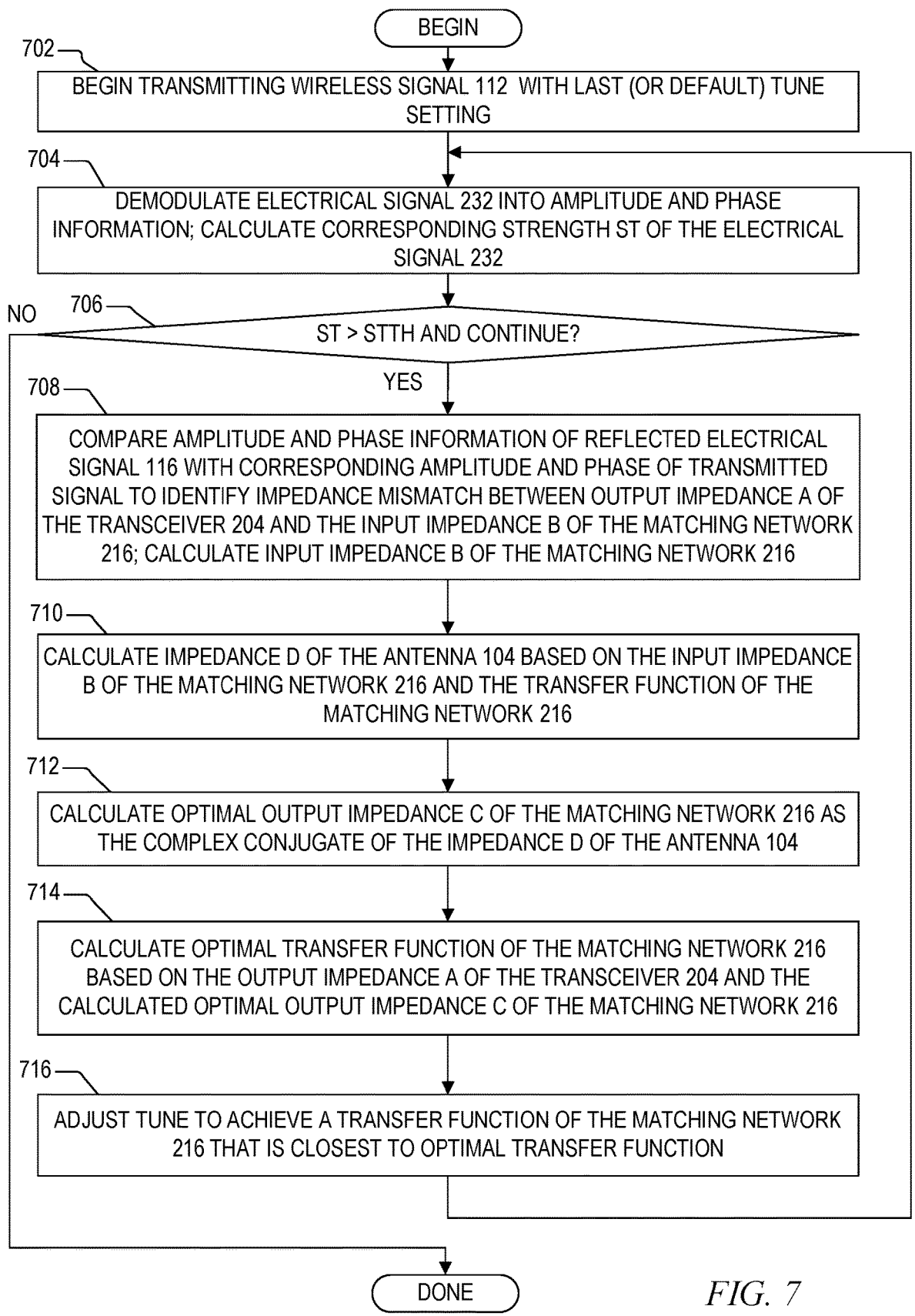
FIG. 7 is a flowchart diagram illustrating operation of the wireless device of FIG. 6 for reducing the power level of the reflected signal according to another embodiment of the present invention.

FIG. 7 is a flowchart diagram illustrating operation of the wireless device 602 for reducing the power level of the reflected electrical signal 116 according to another embodiment of the present invention. At first block 702, the transceiver 204 begins transmitting the wireless signal 112 using the last or default value of TUNE as previously described. At next block 704, the measurement receiver 608 demodulates the electrical signal 232 into corresponding amplitude and phase information. The tuning controller 606 uses this information to calculate a corresponding "strength" of the reflected electrical signal 116 as a strength value ST. ST may be any parameter that indicates the relative size, strength, power level, etc., of the reflected electrical signal 116. In one embodiment, ST is a calculated power level value PL of the reflected electrical signal 116. In another embodiment, ST is simply based on the amplitude information indicative of the relative size of the reflected electrical signal 116. Ultimately, it is desired to retune the antenna 104 to minimize the relative size, strength, power level, etc., of the reflected electrical signal 116 to increase the efficiency of wireless communications.

At next block 706, it is queried whether ST is greater than a predetermined strength threshold value STTH and whether CONTINUE is true. STTH may be fixed or programmable. If ST is less than or equal to STTH, then adjustment of TUNE is not necessary and operation is completed. Also, tuning operation is completed if CONTINUE is false (e.g., transmission of the preamble has completed).

While CONTINUE is true and ST is greater than STTH, operation advances to block 708 in which the tuning controller 606 compares the amplitude and phase information of the reflected electrical signal 116 with the amplitude and phase of the signal being transmitted to identify an impedance mismatch between the output impedance A of the transceiver 204 and the input impedance B of the matching network 216. Since the output impedance A of the transceiver 204 is known, the tuning controller 606 uses this information to calculate the input impedance B of the matching network 216. At next block 710, the tuning controller 606 calculates the impedance D of the antenna 104 based on the input impedance B of the matching network 216 and the known transfer function of the matching network 216. In one embodiment, the tuning controller 606 can readily calculate the transfer function of the matching network 216 based on the current value of TUNE, or the transfer function is stored for each value of TUNE. At next block 712, the tuning controller 606 calculates the optimal output impedance C of the matching network 216 as the complex conjugate of the impedance D of the antenna 104. At next block 714, the tuning controller 606 calculates the optimal transfer function of the matching network 216 based on the known output impedance A of the transceiver 204 and the calculated optimal output impedance C of the matching network 216. At next block 716, the tuning controller 606 adjusts the value of TUNE to achieve a corresponding transfer function of the matching network 216 that is closest to the optimal transfer function calculated at block 714.

Theoretically, once TUNE is adjusted in this manner to re-tune the antenna 104, then the power level of the received signal 116 should be reduced to a minimal level so that further tuning may not be necessary. Nonetheless, operation may return back to block 704 to recalculate the strength ST indicating the updated strength of the reflected electrical signal 116 based on demodulation of the electrical signal 232, and then to block 706 to compare the updated ST with STTH while CONTINUE is true. If for any reason ST is still greater than STTH, operation may be repeated to update TUNE. If ST fails to drop to STTH or less by the time CONTINUE goes false (such as, for example, by the end of the preamble), then remedial measures may be taken at a higher level as previously described.

A potential issue that may arise in certain embodiments is that at or near the optimal impedance matching, the finite isolation of the directional coupler 210 results in the forward electrical signal from the transceiver 204 drowning out the reflected electrical signal 230. This results in a "dead zone" in which measurements may not be completely accurate. Even if the impedance matching is close, for example, it may not be optimal such that further improvement is possible.

One solution is to impose a known step or offset to the matching network 216 to deliberately introduce an impedance mismatch during the strength measurement of the reflected electrical signal 230. Such mismatch is intentionally made to ensure that the reflected electrical signal 230 is sufficiently large or strong (e.g., has sufficient power) for a more accurate impedance estimation. Then, the optimal transfer function can be calculated and programmed to the matching network 216.

Figure 8:
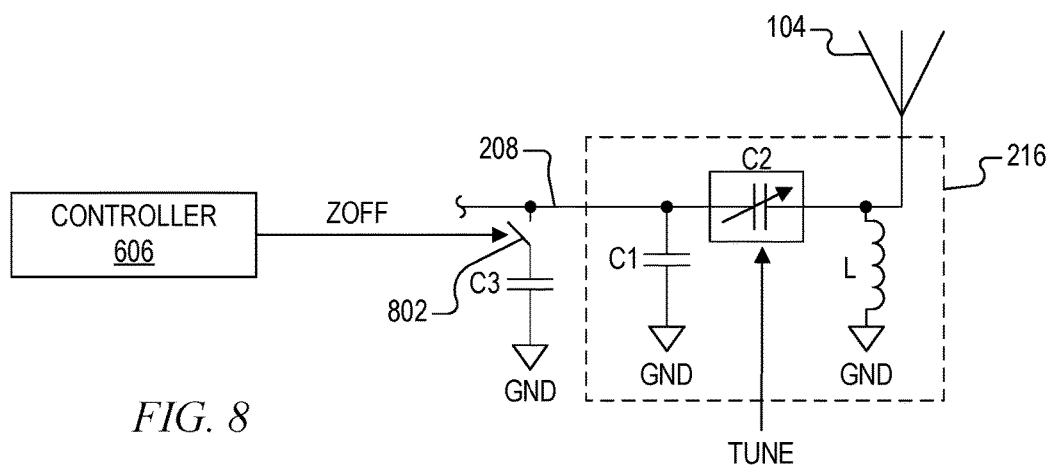
FIG. 8 is a schematic diagram of the matching network of FIG. 2 further coupled to additional components for modifying the matching network transfer function according to one embodiment.

FIG. 8 is a schematic diagram of the matching network 216 coupled to the antenna 104 and further coupled to additional components for modifying the transfer function according to one embodiment. The additional components include a switch 802 and another fixed capacitor C3 coupled in series between the electrical communication path 208 and GND. In one embodiment, the tuning controller 606 provides an impedance offset control signal ZOFF to control the switch 802. When ZOFF is negated low, the switch 802 is opened and the transfer function of the matching network 216 remains unmodified. When ZOFF is asserted high, the switch 802 is closed so that the capacitor C3 is placed in parallel with the capacitor C1 to adjust the transfer function of the matching network 216 by a known or predetermined impedance offset.

Another method of adjusting the transfer function of the matching network 216, other than by selectively adding, adjusting, or removing a switched component or the like, is to adjust TUNE by an offset amount, which may be fixed or programmable in different embodiments.

Figure 9:
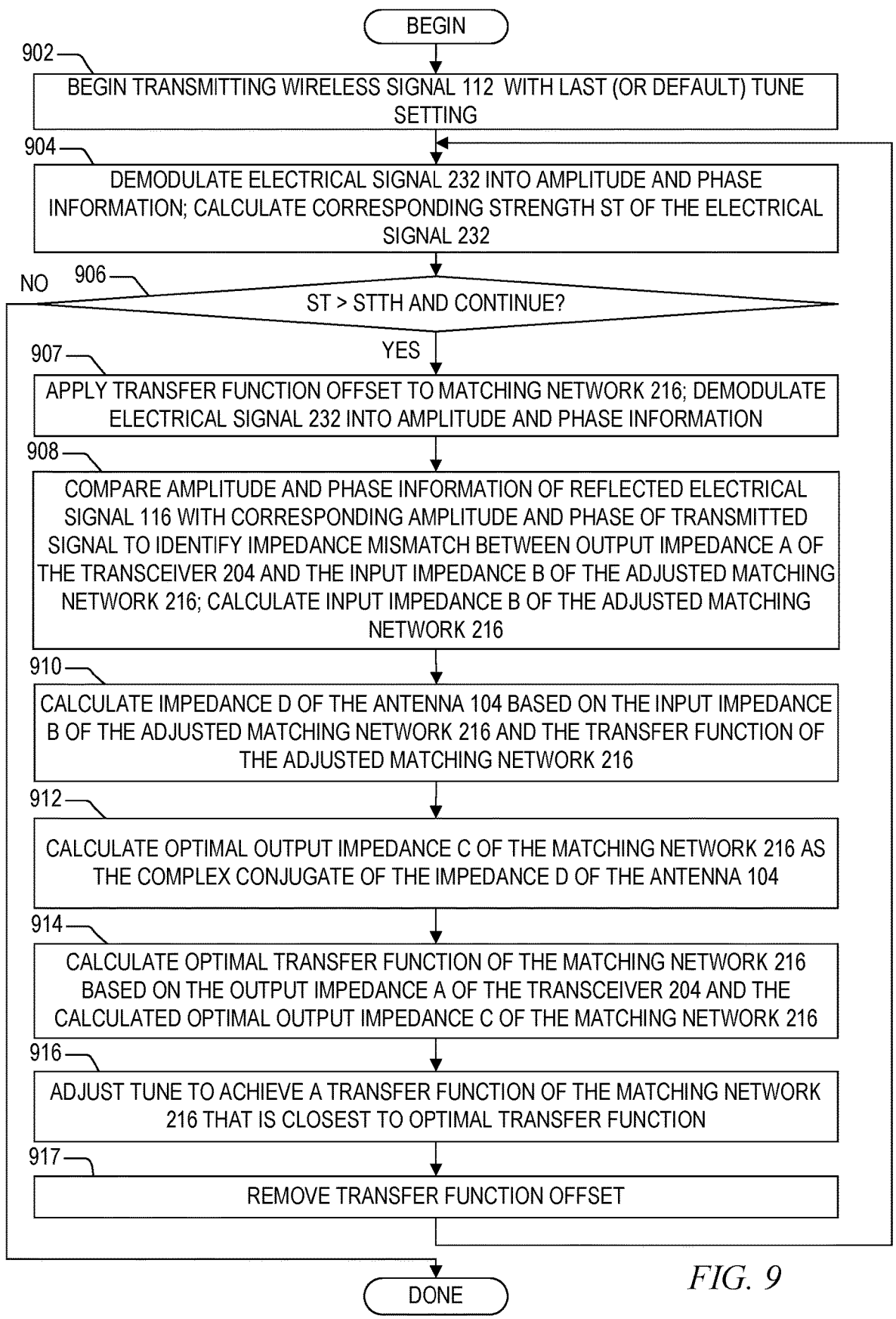
FIG. 9 is a flowchart diagram illustrating operation of the wireless device of FIG. 6 for reducing the power level of the reflected electrical signal using modified matching network transfer function for more accurate impedance measurement according to another embodiment of the present invention.

FIG. 9 is a flowchart diagram illustrating operation of the wireless device 602 for reducing the power level of the reflected electrical signal 116 using modified matching network transfer function for more accurate impedance measurement according to another embodiment of the present invention. The wireless device 602 is configured to adjust the transfer function of the matching network 216 by a known or predetermined impedance offset, such as by adding the switched component C3 216 to the matching network 216 and configuring the tuning controller 606 to provide the ZOFF signal, or otherwise by configuring the tuning controller 606 to adjust TUNE by a predetermined or programmable offset. Blocks 902, 904 and 906 are substantially the same as blocks 702, 704 and 706, respectively. While CONTINUE is true and ST is greater than STTH as determined at block 906, then operation advances to a new block 907 in which a transfer function offset is applied to the matching network 216, such as by asserting ZOFF or by adjusting TUNE or the like.

Blocks 908 and 910 are similar to the blocks 708 and 710, respectively, except with respect to the adjusted matching network 216 (e.g., by adding C3 or by adjusting TUNE). The transfer function of the adjusted matching network 216 may also be calculated by the tuning controller 606, or otherwise the transfer functions of the adjusted matching network 216 may be predetermined and stored for each value of TUNE. Blocks 912, 914, and 916 are substantially the same as the blocks 712, 714, and 716, respectively, for making calculations for the unmodified matching network 216. Again, an optimal output impedance of the matching network 216 is calculated and used to calculate an optimal transfer function of the matching network 216, and then TUNE is adjusted to achieve a transfer function of the matching network 216 that is closest to the calculated optimal transfer function. After block 916, operation advances to block 917 in which the transfer function offset is removed, and then operation returns back to block 904 to demodulate the electrical signal 232 into amplitude and phase information and to calculate the corresponding strength ST for comparison with STTH as previously described. Operation is done when ST is not greater than STTH or when CONTINUE is false as determined at next block 906.

It is noted that if ST is less than or equal to STTH in the first iteration before any transfer adjustment is made, then the reflected electrical signal 230 may have been drown out by the electrical signal asserted by the transceiver 204 so that the impedance matching may not be optimal. In this case the relative strength of the reflected electrical signal 116 may be sufficiently small for reliable wireless communications. In a more robust embodiment, if it is determined that ST is less than or equal to STTH in the first iteration, then operation advances instead to blocks 907-917 to apply the transfer function offset and determine more accurate impedance matching.

The embodiments using a process based on demodulation of the reflected signal and calculation of impedance to adjust TUNE, such as used by the wireless device 602, may potentially converge to a solution much more quickly than configurations based on trial and error or "tweaking" approaches including incremental or binary search methods. The configurations based on demodulation and calculation, however, may include more complicated circuitry, such as, for example, the measurement receiver 608 (as compared to a somewhat simpler power detector 224), and may include more sophisticated processing capacity for calculating impedance values and determining a corresponding optimal value for TUNE. In some embodiments, the transceiver 204 may already include functional circuitry to perform demodulation and additional calculations, although with some modification. Also, the transceiver 204 already includes a receiver and demodulator that may be reconfigured to be used for demodulation of a received signal even during simultaneous transmission to avoid the additional measurement receiver 608.

When the CONTINUE flag is determined based on transmission of the preamble (i.e., true while preamble is being transmitted and otherwise false), then the demodulation approach may be particularly advantageous for configurations using wireless protocols with relatively short preambles. Also, the tweaking approaches, such as using incremental or binary search methods, may be more suitable for wireless configurations with longer preambles, such as Z-wave or the like.

Embodiments of the present invention are also particularly advantageous for wireless protocols having the same transmit and receive frequency. In this manner, once the antenna is optimally tuned for the transmitting signal, the antenna is also optimally tuned for receiving signals at the same frequency. Z-wave, for example, uses time division multiplexing (TDD) with the same transmit and receive frequency. For similar reasons, embodiments of the present invention are also advantageous for wireless protocols with relatively short delay between TX (transmit) and RX (receive) communication sessions. In such configuration, the effect of the nearby object 114 is the same or closely same for TX and RX operation.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A wireless device with adaptive antenna tuning, comprising:
   an antenna;
   a matching network coupled to said antenna and having a tuning input for receiving a tune signal for tuning said antenna;
   an electrical communication path coupled to said matching network for conveying electrical signals to and from said antenna;
   a directional coupler interfacing said electrical communication path to detect a reflected electrical signal from said antenna during transmission of a wireless signal;
   a detector comprising a measurement receiver that demodulates said reflected electrical signal into demodulated information; and
   a controller that uses said demodulated information to adjust said tune signal to reduce said strength of said reflected electrical signal.

2. The wireless device of claim 1, wherein said matching network includes at least one adjustable capacitance that is adjusted by said tune signal.

3. The wireless device of claim 1, wherein said detector further comprises a power detector that provides a power value indicative of a power level of said reflected electrical signal, and wherein said controller repeatedly adjusts said tune signal and monitors said power value to reduce said power value.

4. The wireless device of claim 3, wherein said controller repeatedly adjusts said tune signal and monitors said power value until said power value is no greater than a threshold power value.

5. The wireless device of claim 3, wherein said controller repeatedly adjusts said tune signal by an incremental amount.

6. The wireless device of claim 3, wherein said controller repeatedly adjusts said tune signal according to a binary search method.

7. The wireless device of claim 1, wherein said controller uses said demodulated information to determine a value of said tune signal that achieves an optimal transfer function of said matching network.

8. The wireless device of claim 1, wherein said controller uses said demodulated information to calculate an input impedance of said matching network, to calculate an input impedance of said antenna based on said input impedance of said matching network and a transfer function of said matching network, to calculate an optimal output impedance of said matching network based on said input impedance of said antenna, to calculate an optimal transfer function of said matching network based on said optimal output impedance of said matching network, and to choose a value of said tune signal that adjusts said transfer function of said matching network that is sufficiently close to said optimal transfer function.

9. The wireless device of claim 8, wherein said matching network is modified by a transfer function offset before said reflected electrical signal is demodulated into said demodulated information.

10. The wireless device of claim 1, further comprising a transceiver that performs transmit and receive operations using said electrical communication path and said antenna, and wherein said transceiver comprises a Z-wave transceiver that performs said transmit and receive operations according to a Z-wave wireless communications protocol.

11. A method of adaptively tuning an antenna of a wireless device, comprising:
    detecting a reflected electrical signal on an electrical communication path from the antenna during transmission of a wireless signal;
    demodulating the reflected electrical signal into demodulated information; and
    adjusting, based on the demodulated information, a tune value to reduce the strength of the reflected electrical signal.

12. The method of claim 11, wherein said adjusting comprises adjusting a transfer function of the matching network.

13. The method of claim 12, wherein said adjusting comprises adjusting a capacitance of the matching network.

14. The method of claim 11, further comprising:
    said converting comprises converting the reflected electrical signal into a power value indicative of a power level of the reflected electrical signal; and
    wherein said adjusting comprises repeatedly adjusting the tune value to reduce the power value.

15. The method of claim 14, wherein said repeatedly adjusting comprises repeatedly adjusting the tune value until the power value is no greater than a threshold power value.

16. The method of claim 14, wherein said repeatedly adjusting comprises repeatedly adjusting the tune value by an incremental amount.

17. The method of claim 14, wherein said repeatedly adjusting comprises repeatedly adjusting the tune value according to a binary search method.

18. The method of claim 11, wherein:
    said converting comprises using the demodulated information to determine an optimal transfer function of the matching network; and
    wherein said adjusting comprises adjusting the tune value to modify the transfer function of the matching network towards the optimal transfer function.

19. The method of claim 11, further comprising:
    using the demodulated information to calculate an input impedance of the matching network;
    calculating an input impedance of the antenna based on the input impedance of the matching network and a transfer function of the matching network;
    calculating an optimal output impedance of the matching network based on the input impedance of the antenna;
    calculating an optimal transfer function of the matching network based on the optimal output impedance of the matching network; and
    wherein said adjusting comprises adjusting the tune value to adjust a transfer function of the matching network that is sufficiently close to the optimal transfer function.

20. The method of claim 19, prior to said demodulating the reflected electrical signal, further comprising modifying the matching network by a transfer function offset.

* * * * *